United States Patent
Park et al.

(10) Patent No.: US 10,126,583 B2
(45) Date of Patent: Nov. 13, 2018

(54) LIGHT CONTROLLING DEVICE, TRANSPARENT DISPLAY DEVICE INCLUDING THE SAME, AND METHOD FOR FABRICATING THE SAME

(71) Applicant: LG Display Co., Ltd., Seoul (KR)

(72) Inventors: Sunyoung Park, Paju-si (KR); JiYoung Ahn, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 30 days.

(21) Appl. No.: 14/984,852

(22) Filed: Dec. 30, 2015

(65) Prior Publication Data
US 2017/0097537 A1    Apr. 6, 2017

(30) Foreign Application Priority Data
Oct. 6, 2015   (KR) ................. 10-2015-0140627

(51) Int. Cl.
*G02F 1/1333*   (2006.01)
*G02F 1/1337*   (2006.01)
(Continued)

(52) U.S. Cl.
CPC ...... *G02F 1/133377* (2013.01); *G02F 1/1337* (2013.01); *G02F 1/13394* (2013.01);
(Continued)

(58) Field of Classification Search
CPC ................. G02F 1/133377; G02F 1/13394
See application file for complete search history.

(56) References Cited

U.S. PATENT DOCUMENTS

| 5,766,508 A | 6/1998 | Kawasumi et al. |
| 2006/0044502 A1 | 3/2006 | Takagi |

(Continued)

FOREIGN PATENT DOCUMENTS

| JP | S54-84999 U | 7/1979 |
| JP | S59-69737 A | 4/1984 |

(Continued)

OTHER PUBLICATIONS

Lee, J-H., et al., "Flexible Ferroelectric Liquid Crystal Cell Stabilized by Column Spacer and Polymer Wall: Influence of Bending and Pressing on the Mechanical Stability" Japanese Journal of Applied Physics, 2011, pp. 060204-1-060204-3, vol. 50.
(Continued)

*Primary Examiner* — Kendrick Hsu
(74) *Attorney, Agent, or Firm* — Fenwick & West LLP

(57) ABSTRACT

Embodiments relate to transparent display apparatus including a transparent display panel. The transparent display panel includes a plurality of transmissive areas transmitting incident light and a plurality of emissive areas emitting light and a light control device disposed on one surface of the transparent display panel to execute a transmissive mode, where incident light is transmitted, and a light shield mode where incident light is blocked. The light control device includes a first substrate and a second substrate facing each other, a liquid crystal cell provided between the first substrate and the second substrate, and a partition wall maintaining a cell gap of the liquid crystal cell. The partition wall has a honeycomb structure, and a plurality of column spacers are disposed between partition walls.

22 Claims, 14 Drawing Sheets

(51) Int. Cl.
  *G02F 1/1339* (2006.01)
  *G02F 1/1343* (2006.01)
  *G02F 1/1347* (2006.01)
  *H01L 51/52* (2006.01)
  *H01L 27/32* (2006.01)
  *G02F 1/137* (2006.01)
  *G02F 1/1334* (2006.01)

(52) U.S. Cl.
  CPC .... *G02F 1/13475* (2013.01); *G02F 1/134309* (2013.01); *H01L 27/3232* (2013.01); *H01L 51/5281* (2013.01); *G02F 1/1375* (2013.01); *G02F 1/13725* (2013.01); *G02F 2001/13345* (2013.01); *G02F 2001/13398* (2013.01); *G02F 2201/14* (2013.01); *G02F 2202/043* (2013.01)

(56) References Cited

U.S. PATENT DOCUMENTS

| | | | |
|---|---|---|---|
| 2007/0109466 A1* | 5/2007 | Choi | G02F 1/133377 349/86 |
| 2007/0146619 A1 | 6/2007 | Shyu | |
| 2007/0296886 A1 | 12/2007 | Inada et al. | |
| 2009/0161052 A1 | 6/2009 | Nose et al. | |
| 2013/0016314 A1* | 1/2013 | Itou | G02F 1/133707 349/106 |
| 2013/0136874 A1* | 5/2013 | Xia | C09J 4/00 428/1.5 |
| 2013/0147851 A1 | 6/2013 | Yim et al. | |
| 2013/0314647 A1 | 11/2013 | Yim et al. | |
| 2014/0185129 A1* | 7/2014 | Kim | H01L 51/5284 359/296 |
| 2014/0312328 A1 | 10/2014 | Yoon et al. | |
| 2014/0369072 A1 | 12/2014 | Liao et al. | |
| 2016/0293894 A1 | 10/2016 | Cheng et al. | |
| 2016/0370642 A1* | 12/2016 | Yoon | G02F 1/1341 |

FOREIGN PATENT DOCUMENTS

| | | |
|---|---|---|
| JP | 2003-167238 A | 6/2003 |
| JP | 2005070634 | 3/2005 |
| JP | 2005-148480 A | 6/2005 |
| JP | 2006091200 | 4/2006 |
| WO | WO 2008023416 | 2/2008 |
| WO | WO 2014/104802 A1 | 7/2014 |

OTHER PUBLICATIONS

Office Action for Japanese Patent Application No. JP 2015-255737, dated Aug. 8, 2017, 10 Pages, (With English Translation).

* cited by examiner

LIGHT CONTROLLING DEVICE, TRANSPARENT DISPLAY DEVICE INCLUDING THE SAME, AND METHOD FOR FABRICATING THE SAME

CROSS-REFERENCE TO RELATED APPLICATIONS

This application claims the benefit of the Republic of Korea Patent Application No. 10-2015-0140627 filed on Oct. 6, 2015, which is hereby incorporated by reference as if fully set forth herein.

BACKGROUND

Field of the Invention

The present invention relates to a light control device and a transparent display apparatus.

Discussion of the Related Art

Recently, as society advances to the information-oriented society, the display field of processing and displaying a massive amount of information is rapidly advancing, and correspondingly, various flat panel display (FPD) apparatuses have been developed and are attracting much attention. Examples of the FPD apparatuses include LCD apparatuses, plasma display panel (PDP) apparatuses, field emission display (FED) apparatuses, electroluminescence display (ELD) apparatuses, organic light emitting diode (OLED) display apparatuses, etc.

Recently, FPD apparatuses have become thin and light, and are low in consumption power, and thus, the application field of display apparatuses is continuously increasing. Particularly, a display apparatus is used as a user interface in most electronic devices, mobile devices, etc.

Moreover, transparent display apparatuses which enable a user to see a background or an object disposed on a rear surface thereof are being actively researched recently. The transparent display apparatuses are good in space availability, interior, and design and may be applied to various fields. The transparent display apparatuses realize an information recognition function, an information processing function, and an information display function by using a transparent electronic device, thereby solving the spatial limitation and visual limitation of electronic devices. For example, a transparent display apparatus may be applied to windows of buildings or vehicles and thus may be implemented as a smart window which allows a background to be seen or displays an image.

The transparent display apparatuses may be implemented as organic light emitting display apparatuses. In this case, power consumption is low, a contrast ratio is reduced in an environment having light although a contrast ratio is not changed in a dark environment. The contrast ratio in the dark environment may be defined as a dark room contrast ratio, and the contrast ratio in the environment having light may be defined as a bright room contrast ratio. The transparent display apparatuses include a transmissive area for enabling a user to see a background or an object disposed on a rear surface thereof, and for this reason, the dark room contrast ratio is reduced. Therefore, when a transparent display apparatus is implemented as an organic light emitting display apparatus, the transparent display apparatus may include a light control device for realizing a light shield mode, where light is blocked for preventing the dark room contrast ratio from being reduced, and a transmissive mode where light is transmitted.

The light control device may include a first substrate, a second substrate, a first electrode disposed on the first substrate, a second electrode disposed on the second substrate, a liquid crystal layer that transmits or blocks light by using dichroic dyes and liquid crystal disposed between the first electrode and the second electrode, and a plurality of partition walls for maintaining a constant gap of the liquid crystal layer. Recently, due to the area enlargement of display apparatuses, the transparent display apparatuses are manufactured to have a large area. In this case, the light control device is manufactured to have a large area, and for this reason, the liquid crystal and dichroic dyes of the liquid crystal layer included in the light control device can be partially distributed on one side due to a gravity defect. For this reason, the liquid crystal and the dichroic dyes are non-uniformly distributed in the liquid crystal layer of the light control device, and consequently, a light shield transmittance increases in the light shield mode, whereby a light shield rate is reduced in a portion of the liquid crystal layer.

SUMMARY

Embodiments relate to a light control device including a first substrate, a second substrate parallel to the first substrate, a first electrode on a surface of the first substrate facing the second substrate, a second electrode on a surface of the second substrate facing the first substrate, partitioning walls, a plurality of column spacers and liquid crystal. The partitioning walls are between the first electrode and the second electrode. The partitioning walls partition space between the first electrode and the second electrode. The column spacers are in the partitioned space and are separated from the partitioning wall. The column spacers are between the first electrode and the second electrode to maintain a distance between the first electrode and the second electrode. Liquid crystal is in the partitioned space between the partitioning walls and the plurality of the column spacers.

In one embodiment, each of the plurality of column spacers is pillar shaped with a circular cross-section across a plane parallel to the surfaces of the first and second substrates, the plurality of column spacers separated from each other.

In one embodiment, a set of the partitioning walls form a regular convex polygon shape.

In one embodiment, the regular convex polygon shape is a hexagon.

In one embodiment, the partitioning walls form a honeycomb shape.

In one embodiment, at least one of the set of partitioning wall is separated from another partitioning wall of the set of partitioning wall.

In one embodiment, each of the column spacers is separated from the partitioning walls by at least a predetermined distance.

In one embodiment, the column spacers in the partitioned space are separated by a predetermined interval.

In one embodiment, column spacers adjacent to each of the partitioning walls are separated from each of the partitioning wall by a same distance.

In one embodiment, the light control device further includes a first alignment layer on the first electrode and on the partitioning walls, and a second alignment layer on the second electrode, the second alignment layer attached to portions of the first alignment layer on the portioning walls.

In one embodiment, a first width of a portion of each of the partitioning walls abutting the second alignment layer is larger than a second width of a portion of each of the partitioning walls abutting the first electrode.

In one embodiment, the light control device further includes dichroic dye in the partitioned space.

In one embodiment, the light control device further includes (i) ion material in the partitioned space for moving the dichroic dye and the liquid crystal in response to applying voltage across the first and second electrodes or (ii) polymer network.

In one embodiment, the light control device further includes light activated monomer in the partitioned space.

Embodiment also relate to a method of manufacturing a light control device. A first electrode is formed on a surface of a first substrate. A second electrode is formed on a surface of a second substrate. A plurality of partitioning walls are formed on the first electrode between the second electrode to partition space between the first electrode and the second electrode. A plurality of column spacers are formed between the first electrode and the second electrode in the partitioned space to maintain distance between the first electrode and the second electrode. The column spacers are separated from the partitioning walls. Liquid crystal materials including liquid crystal are filled in the partitioned space between the partitioning walls and the plurality of the column spacers.

In one embodiment, the liquid crystal materials include dichroic dye.

In one embodiment, the liquid crystal materials further include at least one of (i) ion material for moving the dichroic dye and the liquid crystal in response to applying voltage across the first and second electrodes or (ii) polymer network.

Embodiments also relate to a method of manufacturing a light control device. A first electrode is formed on a surface of a first substrate. A second electrode is formed on a surface of a second substrate. A plurality of column spacers are formed on the first electrode to maintain distance between the first electrode and the second electrode. Liquid comprising light activated monomer is filled between the first substrate and the second substrate. Light is irradiated onto selected regions of the filled liquid to form a plurality of partitioning walls that enclose a subset of the plurality of column spacers by solidifying the light activate monomer in the selected regions.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
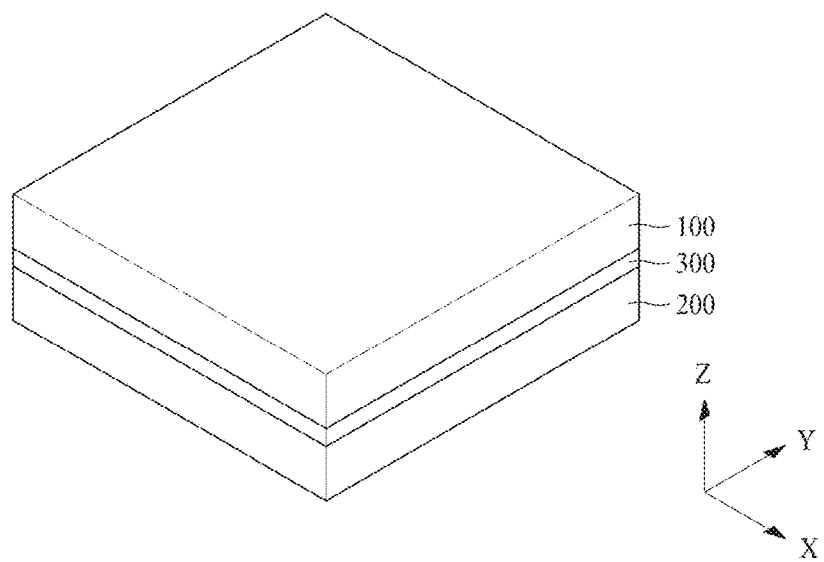
FIG. 1 is a perspective view illustrating a transparent display apparatus according to an embodiment of the present invention.

Reference will now be made in detail with reference to the exemplary embodiments of the present invention, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of a transparent display apparatus according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
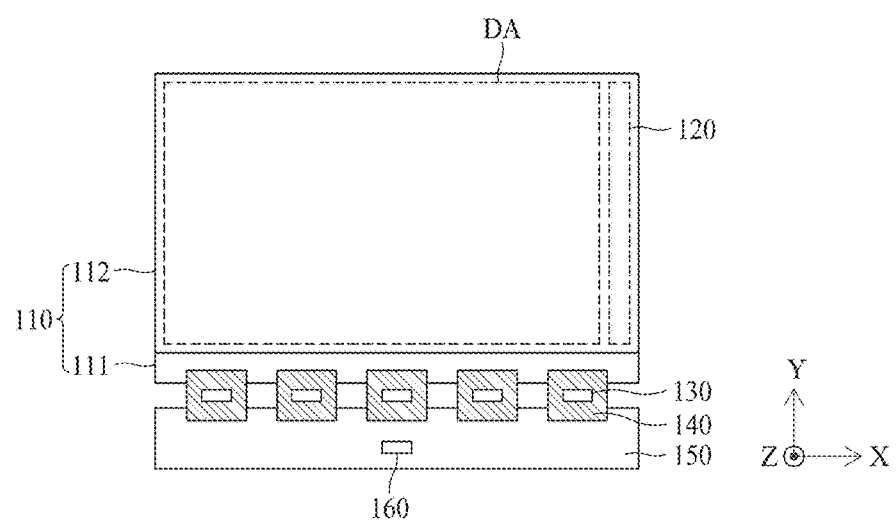
FIG. 2 is a plan view illustrating a transparent display panel, a gate driver, a source drive integrated circuit (IC), a flexible film, a circuit board, and a timing controller of the transparent display apparatus according to an embodiment of the present invention.
Figure 3:
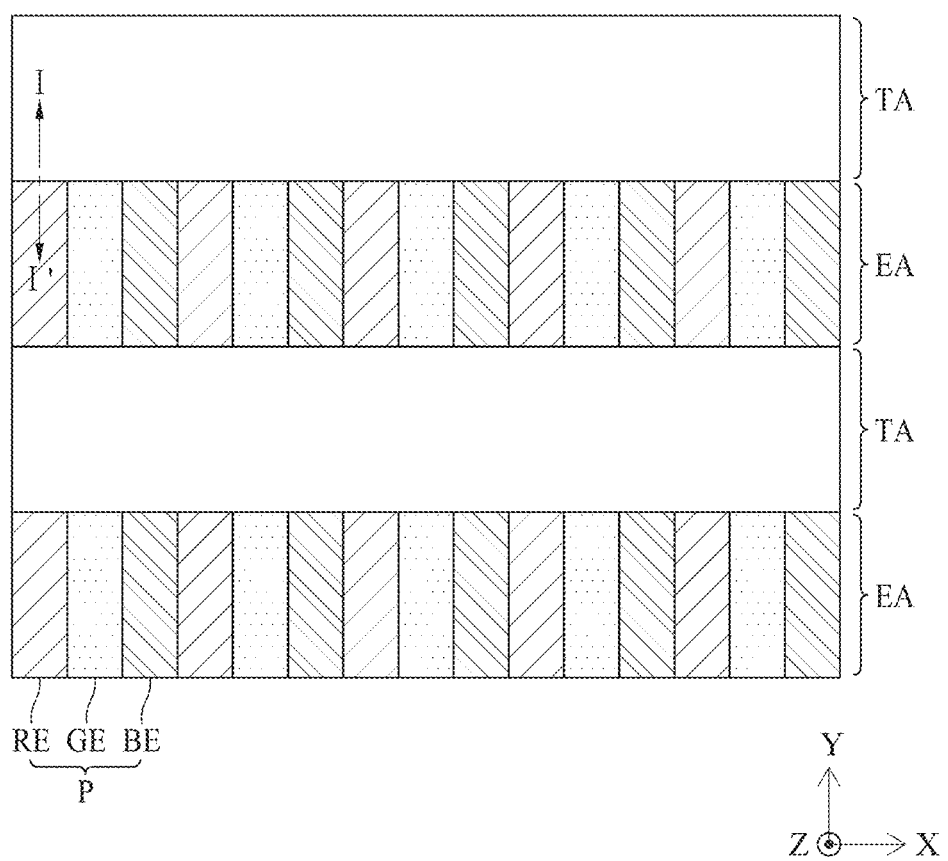
FIG. 3 is a diagram illustrating a transmissive area and an emissive area of a display area illustrated in FIG. 2.
Figure 4:
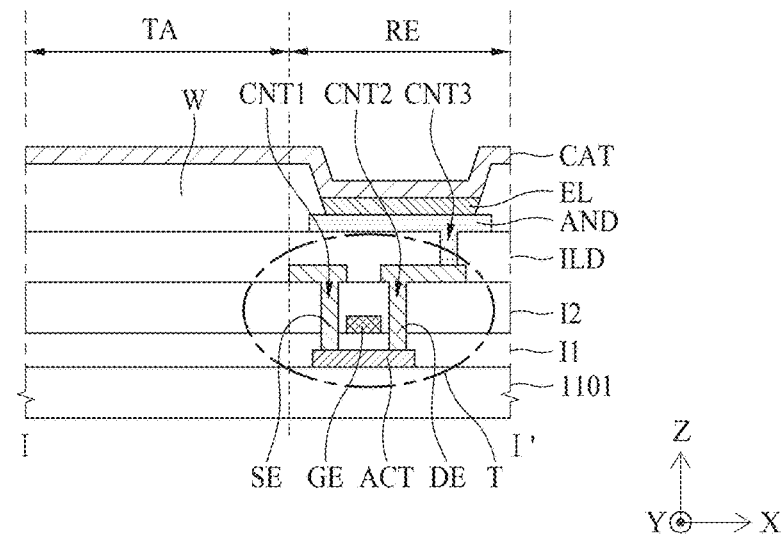
FIG. 4 is a cross-sectional view taken along line I-I' of FIG. 3.
Figure 5:
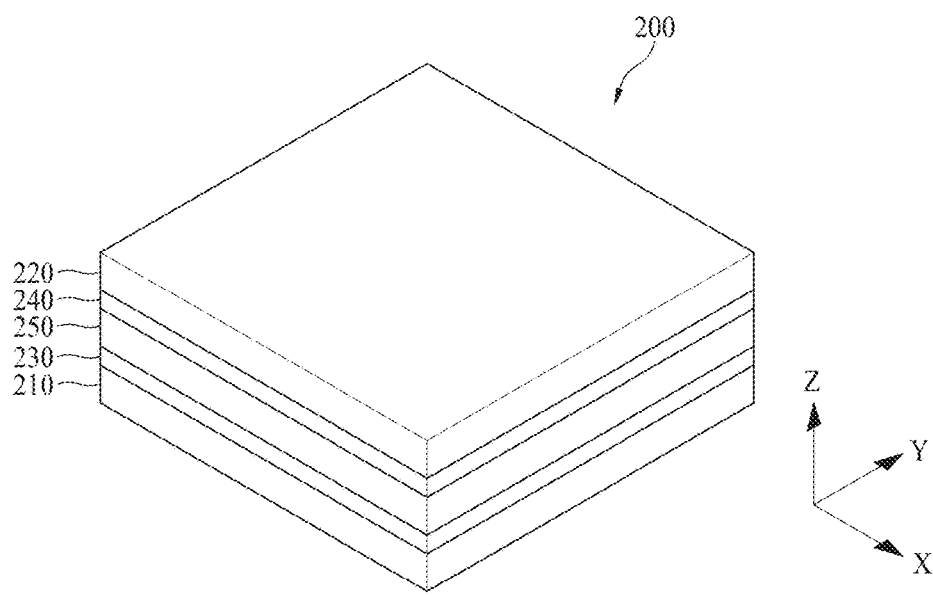
FIG. 5 is a perspective view illustrating in detail a light control device according to an embodiment of the present invention.

FIG. 1 is a perspective view illustrating a transparent display apparatus according to an embodiment of the present invention. FIG. 2 is a plan view illustrating a transparent display panel, a gate driver, a source drive integrated circuit (IC), a flexible film, a circuit board, and a timing controller of the transparent display apparatus according to an embodiment of the present invention. FIG. 3 is a diagram illustrating a transmissive area and an emissive area of a display area illustrated in FIG. 2. FIG. 4 is a cross-sectional view taken along line I-I' of FIG. 3. FIG. 5 is a perspective view illustrating in detail a light control device according to an embodiment of the present invention.

Hereinafter, the transparent display apparatus according to an embodiment of the present invention will be described in detail with reference to FIGS. 1 to 5. In FIGS. 1 to 5, the X axis indicates a direction parallel to a gate line, the Y axis indicates a direction parallel to a data line, and the Z axis indicates a height direction of the transparent display apparatus.

Referring to FIGS. 1 to 5, the transparent display apparatus according to an embodiment of the present invention may include a transparent display panel 100, a gate driver 120, a source drive integrated circuit (IC) 130, a flexible film 140, a circuit board 150, a timing controller 160, a light control device 200, and an adhesive layer 300.

The transparent display apparatus according to an embodiment of the present invention is described as being implemented as an organic light emitting display apparatus, but is not limited thereto. In other embodiments, the transparent display apparatus according to an embodiment of the present invention may be implemented as an LCD apparatus or an electrophoresis display apparatus.

The transparent display panel 100 may include a lower substrate 111 and an upper substrate 112. The upper substrate 112 may be an encapsulation substrate. The lower substrate 111 may be formed greater than the upper substrate 112, and thus, a portion of the lower substrate 111 may be exposed without being covered by the upper substrate 112.

A plurality of gate lines and a plurality of data lines may be formed in a display area DA of the transparent display panel 100, and a plurality of emission parts may be respectively provided in intersection areas of the gate lines and the data lines. The emission parts disposed in the display area DA may display an image.

The display area DA, as illustrated in FIG. 3, may include a transmissive area TA and an emissive area EA. The transmissive area TA of the transparent display panel 100 enables a user to see a background or an object located behind a rear surface of the transparent display panel 100, and the emissive area EA may display an image. FIG. 3 illustrates the transmissive area TA and the emissive area EA are disposed along a direction (an X-axis direction) of the gate line, but the present embodiment is not limited thereto. That is, the transmissive area TA and the emissive area EA may be disposed along a direction (a Y-axis direction) of the data line.

The transmissive area TA may be an area through which most of incident light passes through. The emissive area EA may be an area that emits light. The emissive area EA may include a plurality of pixels P. Each of the pixels P is illustrated as including a red emission part RE, a green emission part GE, and a blue emission part BE as illustrated in FIG. 3, but is not limited thereto. For example, each of the pixels P may further include a white emission part in addition to the red emission part RE, the green emission part GE, and the blue emission part BE. Alternatively, each of the pixels P may include two or more of a red emission part RE, a green emission part GE, a blue emission part BE, a yellow emission part, a magenta emission part, and a cyan emission part.

The red emission part RE may be an area that emits red light, the green emission part GE may be an area that emits green light, and the blue emission part BE may be an area that emits blue light. The red emission part RE, the green emission part GE, and the blue emission part BE disposed in the emissive area EA may each correspond to a non-transmissive area that emits certain light and does not transmit incident light.

Each of the red emission part RE, the green emission part GE, and the blue emission part BE, as illustrated in FIG. 4, may include a transistor T, an anode electrode AND, an organic layer EL, and a cathode electrode CAT.

The transistor T may include an active layer ACT disposed on the lower substrate 111, a first insulation layer I1 disposed on the active layer ACT, a gate electrode GE disposed on the first insulation layer I1, a second insulation layer I2 disposed on the gate electrode GE, and a source electrode SE and a drain electrode DE which are disposed on the second insulation layer I2 and are connected to the active layer ACT through first and second contact holes CNT1 and CNT2. In FIG. 4, the transistor T is illustrated as being formed in a top gate type, but is not limited thereto. In other embodiments, the transistor T may be formed in a bottom gate type.

The anode electrode AND may be connected to the drain electrode DE of the transistor T through a third contact hole CNT3 that passes through an interlayer dielectric ILD disposed on the source electrode SE and the drain electrode DE. A partition wall W may be disposed between adjacent anode electrodes AND, and thus, the adjacent anode electrodes AND may be electrically insulated from each other.

The organic layer EL may be disposed on the anode electrode AND. The organic layer EL may include a hole transporting layer, an organic light emitting layer, and an electron transporting layer. The cathode electrode CAT may be disposed on the organic layer EL and the partition wall W. When a voltage is applied to the cathode electrode CAT and the anode electrode AND, a hole may move to the organic light emitting layer through the hole transporting layer, and an electron may move to the organic light emitting layer through the electron transporting layer, whereby the hole and electron may be combined with each other to emit light.

In FIG. 4, the transparent display panel 100 is illustrated as being implemented in a top emission type, but in other embodiments, the transparent display panel 100 may be implemented in a bottom emission type. The light control device 200 may be disposed in a direction opposite to a direction in which the transparent display panel 100 emits light. Therefore, in the top emission type, the light control device 200 may be disposed under the transparent display panel 100, namely, under the lower substrate 111. In the bottom emission type, the light control device 200 may be disposed on the transparent display panel 100, namely, on the upper substrate 112.

In the top emission type, since light emitted from the organic layer EL is irradiated in a direction toward the upper substrate 112, the transistor T may be spaciously provided under the partition wall W and the anode electrode AND. Therefore, a design area of the transistor T is broader in the top emission type than the bottom emission type. In the top emission type, the anode electrode AND may be formed of a metal material having a high reflectance, such as aluminum, a stacked structure of aluminum and indium tin oxide (ITO), and/or the like, and the cathode electrode CAT may be formed of a transparent metal material such as ITO, indium zinc oxide (IZO), and/or the like.

As described above, each of the pixels P of the transparent display apparatus according to an embodiment of the present invention may include the transmissive area TA, which transmits almost all of incident light passes as-is, and the emissive area EA that emits light. Accordingly, in an embodiment of the present invention, a user can see a background or an object, located on the rear surface of the transparent display apparatus, through the transmissive area TA of the transparent display apparatus.

The gate driver 120 may supply gate signals to the gate lines according to a gate control signal input from the timing controller 160. In FIG. 2, the gate driver 120 is illustrated as being provided in a gate driver in panel (GIP) type in one side of the display area DA of the transparent display panel 100, but is not limited thereto. That is, the gate driver 120 may be provided in the GIP type outside both sides of the display area DA of the transparent display panel 100. Alternatively, the gate driver 120 may be manufactured as a driving chip, mounted on the flexible film 140, and attached to the transparent display panel 100 in a tape automated bonding (TAB) type.

The source drive IC 130 may receive digital video data and a source control signal from the timing controller 160. The source drive IC 130 may convert the digital video data into analog data voltages to respectively supply the analog data voltages to the data lines according to the source control signal. If the source drive IC 130 is manufactured as a driving chip, the source drive IC 130 may be mounted on the flexible film 140 in a chip on film (COF) type or a chip on plastic (COP) type.

The lower substrate 111 may be formed greater than the upper substrate 112, and thus, a portion of the lower substrate 111 may be exposed without being covered by the upper substrate 112. A plurality of pads such as data pads may be provided on the exposed portion of the lower substrate 111 which is not covered by the upper substrate 112. A plurality of lines which connect the pads to the source drive IC 130 and a plurality of lines which connect the pads to lines of the circuit board 150 may be disposed on the flexible film 140. The flexible film 140 may be attached to the pads by using an anisotropic conducting film, and thus, the pads may be connected to the lines of the flexible film 140.

The circuit board 150 may be attached to the flexible film 140. A plurality of circuits each of which are implemented as a driving chip may be mounted on the circuit board 150. For example, the timing controller 160 may be mounted on the circuit board 150. The circuit board 150 may be a printed circuit board (PCB) or a flexible PCB (FPCB).

The timing controller 160 may receive digital video data and a timing signal from an external system board (not shown). The timing controller 60 may generate the gate control signal for controlling an operation timing of the gate driver 120 and the source control signal for controlling the source drive IC 130, based on the timing signal. The timing controller 60 may supply the gate control signal to the gate driver 120 and may supply the source control signal to the source drive IC 130.

The light control device 200 may block incident light in a light shield mode, and in a transmissive mode, the light control device 200 may transmit the incident light. The light control device 200, as illustrated in FIG. 5, may include a first substrate 210, a second substrate 220, a first electrode 230, a second electrode 240, and a liquid crystal layer 250.

Each of the first and second substrates 210 and 220 may be a plastic film. For example, each of the first and second substrates 210 and 220 may be a sheet or a film including cellulose resin such as triacetyl cellulose (TAC) or diacetyl cellulose (DAC), cyclo olefin polymer (COP) such as norbornene derivatives, cyclo olefin copolymer (COC), acrylic resin such as poly(methylmethacrylate) (PMMA), polyolefin such as polycarbonate (PC), polyethylene (PE), or polypropylene (PP), polyester such as polyvinyl alcohol (PVA), poly ether sulfone (PES), polyetheretherketone (PEEK), polyetherimide (PEI), polyethylenenaphthalate (PEN), or polyethyleneterephthalate (PET), polyimide (PI), polysulfone (PSF), or fluoride resin, but is not limited thereto.

The first electrode 230 may be provided on one surface of the first substrate 210, and the second electrode 240 may be provided on one surface of the second substrate 220 facing the first substrate 210. Each of the first and second electrodes 230 and 240 may be a transparent electrode.

Each of the first and second electrodes 230 and 240 may be formed of silver oxide (for example, $AgO$, $Ag_2O$, or $Ag_2O_3$), aluminum oxide (for example, $Al_2O_3$), tungsten oxide (for example, $WO_2$, $WO_3$, or $W_2O_3$), magnesium oxide (for example, $MgO$), molybdenum oxide (for example, $MoO_3$), zinc oxide (for example, $ZnO$), tin oxide (for example, $SnO_2$), indium oxide (for example, $In_2O_3$), chromium oxide (for example, $CrO_3$ or $Cr_2O_3$), antimony oxide (for example, $Sb_2O_3$ or $Sb_2O_5$), titanium oxide (for example, $TiO_2$), nickel oxide (for example, $NiO$), copper oxide (for example, $CuO$ or $Cu_2O$), vanadium oxide (for example, $V_2O_3$ or $V_2O_5$), cobalt oxide (for example, $CoO$), iron oxide (for example, $Fe_2O_3$ or $Fe_3O_4$), niobium oxide (for example, $Nb_2O_5$), ITO, IZO, aluminum doped zinc oxide (ZAO), aluminum tin oxide (TAO), or antimony tin oxide (ATO), but is not limited thereto.

The liquid crystal layer 250 may be operate in a transmissive mode where incident light is transmitted, and a light shield mode where the incident light is blocked. A transmittance of the light control device 100 may represent a ratio of light, which is incident on the light control device 100, to light output from the light control device 100.

The liquid crystal layer 250 may be a guest host liquid crystal layer which includes liquid crystal and dichroic dyes. In this case, the liquid crystal may be a host material, and the dichroic dyes may be guest materials. Alternatively, the liquid crystal layer 250 may be a polymer network liquid crystal layer which includes the liquid crystal, the dichroic dyes, and a polymer network. In this case, the liquid crystal layer 250 increases a scattering effect of incident light due to the polymer network. Alternatively, the liquid crystal layer 250 may be a dynamic scattering mode liquid crystal layer which includes the liquid crystal, the dichroic dyes, and ion materials. In a dynamic scattering mode, when an alternating current (AC) voltage is applied to the first and second electrodes 230 and 240, the ion materials may allow the liquid crystal and the dichroic dyes to move randomly.

The transparent display panel 100 may be adhered to the light control device 200 by the adhesive layer 300. The adhesive layer 300 may be a transparent adhesive film such as an optically clear adhesive (OCA) or a transparent adhesive such as an optically clear resin (OCR). In this case, the adhesive layer 300 may have a refractive index of 1.4 to 1.9 for refractive index matching between the transparent display panel 100 and the light control device 200.

If the light control device 200 is attached to the transparent display panel 100 in a direction in which the transparent display panel 100 emits light, a plurality of light shield areas should be formed by patterning the light control device 200 and should be aligned to correspond to a plurality of transmissive areas TA of the transparent display panel 100, and thus, the light control device 200 may be attached to the transparent display panel 100 in a direction opposite to the direction in which the transparent display panel 100 emits the light. For example, if the transparent display panel 100 is the top emission type, the light control device 200 may be disposed under the transparent display panel 100, namely, under the lower substrate 111. If the transparent display panel 100 is the bottom emission type, the light control device 200 may be disposed on the transparent display panel 100, namely, on the upper substrate 112.

Figure 6:
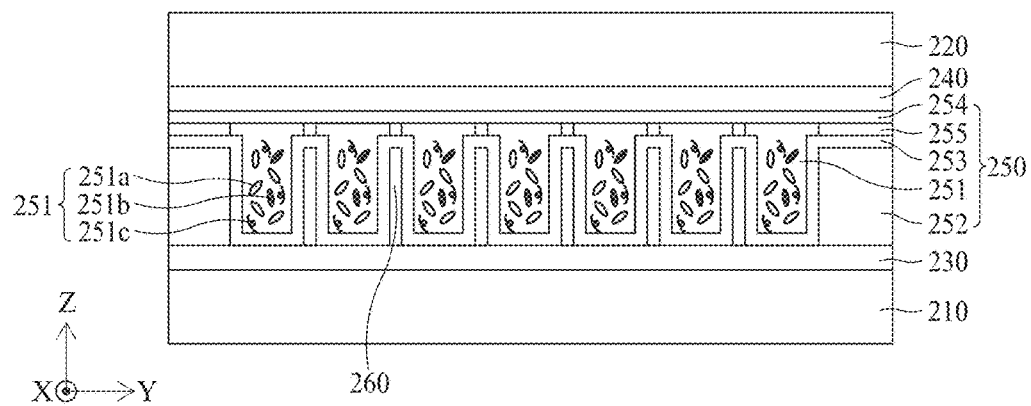
FIG. 6 is a cross-sectional view of one side of FIG. 5.

FIG. 6 is a cross-sectional view of one short side of FIG. 5. For convenience of description, the liquid crystal layer 250 is illustrated as being implemented as the dynamic scattering mode liquid crystal layer. In detail, as illustrated in FIG. 6, the liquid crystal layer 250 may include a plurality of liquid crystal cells 251, partition wall 252, a first alignment layer 253, a second alignment layer 254, an adhesive layer 255, and a plurality of column spacers 260.

The liquid crystal cells 251 may each include liquid crystal 251a, dichroic dyes 251b, and ion materials 251c. The liquid crystal 251a may be nematic liquid crystal whose alignment is changed by a vertical (a Z-axis direction) electric field between the first and second electrodes 230 and 240, but are not limited thereto. When a voltage is not applied to the first and second electrodes 230, 240, the liquid crystal 251a may be negative liquid crystal which is aligned in a vertical direction (the Z-axis direction) by the first and second alignment layers 253, 254.

An alignment of the dichroic dyes 251b may be changed by a vertical (a Y-axis direction) electric field like the liquid crystal 251a. Also, when the voltage is not applied to the first and second electrodes 230, 240, like the liquid crystal 251a, the dichroic dyes 251b may be aligned in the vertical direction (the Z-axis direction) by the first and second alignment layers 253, 254.

The dichroic dyes 251b may be dyes that absorb light. For example, the dichroic dyes 251b may be black dyes, which absorbs all of light having a visible light wavelength range, or dyes which absorb light outside a wavelength range of a specific color (for example, red) and reflect light having the wavelength range of the specific color (for example, red). In an embodiment of the present invention, the dichroic dyes 251b may use the black dyes for increasing a light shield rate at which light is blocked, but are not limited thereto. For example, the dichroic dyes 251b may be dyes having one of red, green, blue, and yellow or dyes having a color produced by a combination thereof. That is, according to an embodiment of the present invention, in the light shield mode, various colors instead of black-based colors may be expressed, and a background may be blocked. Therefore, according to an embodiment of the present invention, various colors may be provided in the light shield mode, and thus, a user feels a sense of beauty. For example, the transparent display apparatus according to an embodiment of the present invention may be used at public places, and if the transparent display apparatus is applied to a smart window or a public window that has the transmissive mode and the light shield mode, the transparent display apparatus may block light while expressing various colors.

The ion materials 251c may allow the liquid crystal and the dichroic dyes to move randomly. The ion materials 251c may have a certain polarity, and in this case, the ion materials 251c may move to the first electrode 230 or the second electrode 240 according to the polarity of a voltage applied to the first and second electrodes 230, 240. For example when a voltage having a positive polarity is applied to the first electrode 230 and a voltage having a negative polarity is applied to the second electrode 240 in a case where the ion materials 251c have a negative polarity, the ion materials 251c may move to the first electrode 230. Also, when a voltage having a positive polarity is applied to the second electrode 240 and a voltage having a negative polarity is applied to the first electrode 230 in a case where the ion materials 251c have a negative polarity, the ion materials 251c may move to the second electrode 240. Also, when the ion materials 251c have a positive polarity, a voltage of a positive polarity applied to the first electrode 230 and a voltage of a negative polarity is applied to the second electrode 240, the ion materials 251c may move to the second electrode 240. Also, in a case where the ion materials 251c have a positive polarity, when a voltage having a positive polarity is applied to the second electrode 240 and a voltage having a negative polarity is applied to the first electrode 230, the ion materials 251c may move to the first electrode 230.

Therefore, when an AC voltage having a certain period is applied to the first and second electrodes 230, 240, the ion materials 251c may repeat an operation where the ion materials 251c move from the first electrode 230 to the second electrode 240 and then again move to the first electrode 230 at certain periods. In this case, the ion materials 251c may bump against the liquid crystal 251a and the dichroic dyes 251b while moving, and thus, the liquid crystal 251a and the dichroic dyes 251b may move randomly.

Alternatively, the ion materials 251c may exchange electrons according to a polarity of a voltage applied to the first and second electrodes 230 and 240. Therefore, when an AC voltage having a certain period is applied to the first and second electrodes 230 and 240, the ion materials 251c may exchange electrons at certain periods. In this case, the ion materials 251c may bump against the liquid crystal 251a and the dichroic dyes 251b while moving, and thus, the liquid crystal 251a and the dichroic dyes 251b may move randomly.

The light control device 200 according to an embodiment of the present invention may not apply a voltage to the first and second electrodes 230, 240 in the transmissive mode, and in this case, the liquid crystal 251a and dichroic dyes 251b of each of the liquid crystal cells 251 may be aligned in the vertical direction (the Z-axis direction) by the first and second alignment layers 253, 254. Therefore, the liquid crystal 251a and the dichroic dyes 251b may be aligned in a direction in which light is incident, and thus, the incidences of scattering and absorption of light by the liquid crystal 251a and the dichroic dyes 251b are minimized. Accordingly, most of light incident on the light control device 200 may pass through the liquid crystal cells 251.

Moreover, the light control device 200 according to an embodiment of the present invention may apply an AC voltage having a certain period to the first and second electrodes 230 and 240 in the light shield mode, and in this case, the liquid crystal 251a and the dichroic dyes 251b may randomly move according to movement of the ion materials 251c. Therefore, since the liquid crystal 251a and the dichroic dyes 251b move randomly, the light may be scattered by the liquid crystal 251a or may be absorbed by the dichroic dyes 251b. Accordingly, most of the light incident on the light control device 200 may be blocked by the liquid crystal cells 251.

The partition wall 252 is described below with reference to FIG. 7 along with the column spacers 260.

The first alignment layer 253 may be provided on the first electrode 230 and the partition wall 252. The second alignment layer 254 may be provided on the second electrode 240. Each of the first and second alignment layers 253 and 254 may be a vertical alignment layer that allows the liquid crystal 251a and the dichroic dyes 251b to be aligned in the vertical direction (the Z-axis direction) when a voltage is not applied to the first and second electrodes 230 and 240.

The adhesive layer 255 may be provided on the first alignment 253 provided on the partition wall 252. Therefore, the first alignment layers 253, 254 provided on the partition wall 252 may be adhered to each other by the adhesive layer 255. In FIG. 6, the adhesive layer 255 is illustrated as being provided on only the first alignment layer 253 provided on the partition wall 252, but may be provided on the liquid crystal cells 251 as well as the partition wall 252.

Figure 7:
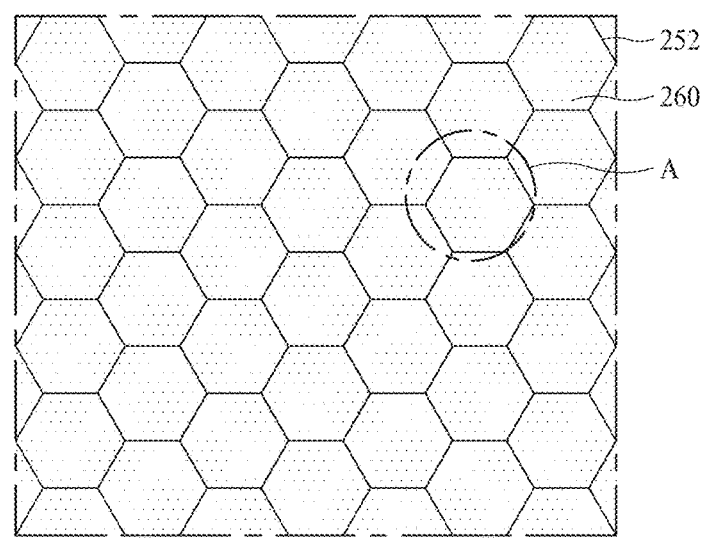
FIG. 7 is a plan view illustrating some of a plurality of partition walls and a plurality of column spacers included in the light control device.
Figure 8:
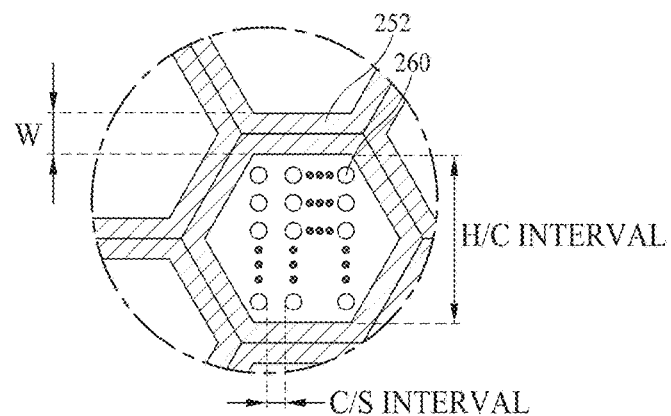
FIG. 8 is an enlarged view of an area A of FIG. 7.

FIG. 7 is a plan view of a partition wall structure of a light control device according to a first embodiment of the present invention. FIG. 8 is an enlarged view of an area A of FIG. 7. A light shield rate and a light shield transmission rate to be described below may be defined as follows. A light shield rate in the light shield mode of the light control device 200 may be simply referred to as a light shield rate, and a transmittance in the light shield mode may be simply referred to as a light shield transmission rate. In the light shield mode, as the light shield rate becomes higher and the light shield transmission rate becomes lowers, a light shield effect is better.

Referring to FIG. 7, the partition wall 252 may have a hexagonal honeycomb structure, and the plurality of column spacers 260 may be arranged at certain intervals between a plurality of the partition walls 252. The light control device 200 according to an embodiment of the present invention is described as including the partition wall 252 having the honeycomb structure, but this is for convenience of description. In other embodiments, the light control device 200 may include a partition wall having an n-angular cross-sectional surface (where n is a natural number more than three).

The partition wall 252 may be formed of a transparent material. In this case, the partition wall 252 may be formed of one of photoresist, an ultraviolet (UV) curable polymer, and polydimethylsiloxane, but is not limited thereto.

Moreover, unlike the liquid crystal cells 251, the partition wall 252 cannot actively transmit light or cannot block the light. That is, if the partition wall 252 is formed of a transparent material, the partition wall 252 may transmit the light but cannot block the light. Also, if the partition wall 252 includes a material absorbing the light or a material scattering the light, the partition wall 252 may merely scatter or block the light, but cannot transmit the light. In embodiments of the present invention, the partition wall 252 and the column spacer 260 are formed of the same transparent material.

If the partition wall 252 of the light control device 200 has an opened structure like a stripe form, the liquid crystal layer 250 may not be fixed. For this reason, a gravity defect where the liquid crystal and dichroic dyes of the liquid crystal layer 250 are unevenly distributed on one side occurs over a large area. Therefore, the partition wall 252 may be formed in a closed structure like a honeycomb form, for solving a problem such as the gravity defect and the like. In this case, in the partition wall 252 having the honeycomb form, a light shield rate is reduced due to an area occupied by the partition wall 252, and when an interval between partition walls 252 is broadened for preventing the reduction in the light shield rate, a tradeoff relationship where it is difficult to maintain a gap between the first substrate 210 and the second substrate 220 occurs.

Therefore, a partition wall structure of the light control device 200 according to an embodiment of the present invention for solving the above-described problems may be provided in a hybrid type that has the partition wall 252 having the honeycomb structure and a structure of the column spacer 260. The partition wall 252 having the honeycomb structure may allow the liquid crystal layer 250 to be located between partition walls, thereby preventing the gravity defect where the liquid crystal and dichroic dyes of the liquid crystal layer 250 are partially distributed to one side. Also, the column spacers 260 provided between a plurality of the partition walls 252 having the honeycomb structure prevents a laminating process defect and the difficulty of maintaining a gap between the first substrate 210 and the second substrate 220 arises because an interval between the partition walls 252 of the honeycomb structure increases. The laminating process defect refers to a process defect where the first substrate 210 clings to the second substrate 220.

In the light control device 200 according to an embodiment of the present invention with the partition wall 252 of a honeycomb structure and the column spacers 260, a light shield transmission rate is further increased compared to a light control device that lacks the partition wall 252 and the column spacers 260 due to an area occupied by the structure of the partition wall 252 and an area occupied by the structure of the column spacers 260. If the light shield transmission rate increases, a light shield rate is reduced in the light shield mode of the light control device 200, and thus, the light shield transmission rate may be set as low as possible. For example, an area of each of the partition wall 252 having the honeycomb structure and the column spacers 260 may be designed so that the light shield transmission rate does not exceed 0.7% in comparison with the light control device lacking the partition wall 252 of a honeycomb structure and the column spacers 260.

FIG. 8 illustrates numerical values associated with a partition wall and a column spacer for calculating a configuration to solve the above-described issues and satisfy the light shield transmission rate. As illustrated in FIG. 8, a line width W denotes a thickness corresponding to a sum of one partition wall 252 having the honeycomb structure and other one partition wall 252 having the honeycomb structure which contacts the one partition wall 252. When an area attributable to the line width W increases, the light shield rate is reduced. Thus, a line width of the honeycomb partition wall 252 may have a range from 10 μm to 50 μm.

In this case, as a thickness of each of the honeycomb partition wall 252 and the column spacer 260 becomes thicker, the light shield rate is reduced. For this reason, an efficiency of the light control device 200 is reduced. Therefore, in an embodiment of the present invention, the honeycomb partition wall 252 and the column spacer 260 may be set to have the same thickness, but are not limited thereto.

A C/S interval denotes a shortest distance between the column spacers 260 which are provided between the partition walls 252 having the honeycomb structure. The column spacers 260 may be previously designed to have a certain interval therebetween. When an interval between the column spacers 260 increases, it becomes more difficult to maintain a gap between the first substrate 210 and the second substrate 220. Hence, the increased interval between the column spacers 260 may result in a laminating process problem. Also, if an interval between the column spacers 260 is too small, the total number of the column spacers 260 increases, and for this reason, the light shield rate is reduced. Accordingly, in the light control device 200 according to an embodiment of the present invention, an interval between the column spacers 260 may have a range from 100 μm to 500 μm.

A C/S number denotes the total number of the column spacers 260 provided between the partition walls 252 having the honeycomb structure. When the C/S number increases, a total area occupied by the column spacers 260 is increased. As a result, the light shield rate is reduced.

An H/C interval denotes a distance from one side to an opposite side of the partition wall 252 of a honeycomb structure. When the H/C interval of the partition wall 252 which fixes the liquid crystal layer 250 is increased without causing a defect, a reduction in the light shield rate caused by an area of the partition wall 252 is reduced.

An area ratio B denotes a ratio of an area occupied by the liquid crystal layer 250 to an area corresponding to a sum of the honeycomb partition wall 252 and the column spacer 270. In the light control device 200 according to an embodiment of the present invention, the area ratio B may have a value from 1% to 2% for increasing the light shield transmission rate by 0.7%.

As described above, the light control device 200 according to an embodiment of the present invention may control the light shield transmission rate by adjusting an area ratio, and if the area ratio is fixed to a fixed variable, the line width W and interval of the honeycomb partition walls 252 may be designed, and the interval and the number of the column spacers 260 may be designed. Therefore, the light control device 200 according to an embodiment of the present invention maintains the light shield transmission rate identically to that of the related art light control device but also solves a gravity defect, a laminating process defect, and the difficulty of maintaining a gap between the first substrate 210 and the second substrate 220 of the related art light control device.

Figure 9:
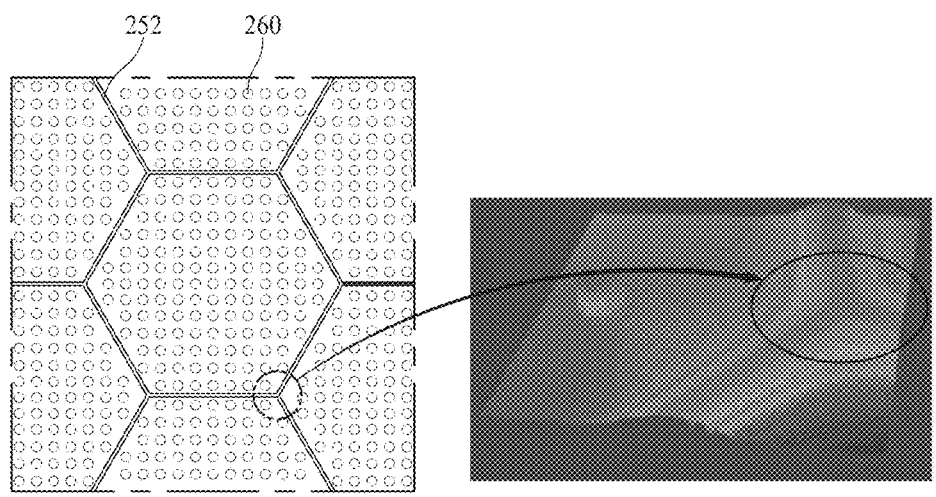
FIG. 9 is a diagram illustrating a residual layer caused by a contact point of a partition wall.
Figure 10:
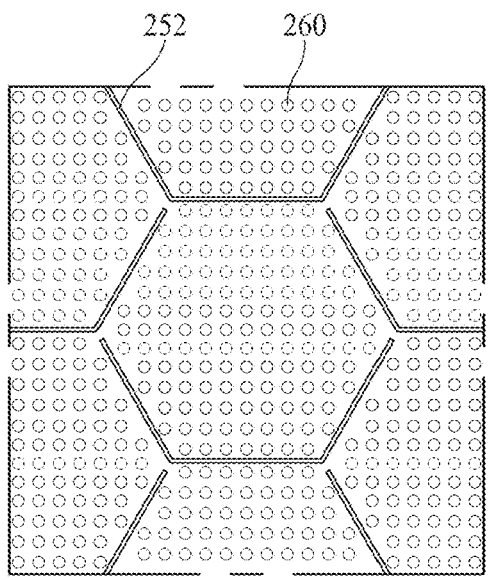
FIG. 10 is an enlarged view illustrating another example of an area A of FIG. 7.

FIG. 9 is a diagram illustrating a residual layer which occurs in each of contact points between sides of the partition wall 252 having the honeycomb structure, and FIG. 10 is a diagram illustrating a light control device 200 according to a second embodiment of the present invention.

As seen in FIG. 9, a honeycomb structure has the above-described line width W, and three sides may meet each other at a junction point of the honeycomb partition wall 252. Therefore, the junction point causes a residual layer, increasing visibility of the partitioning wall 252. As a result, a display defect may occur, the light shield rate may be reduced, and the light may be leaked.

Referring to FIG. 10, a structure of the honeycomb partition wall 252 of the light control device 200 according to the second embodiment of the present invention may have a structure where there is no junction point where three sides meet. Specifically, a side is separated from the junction point where two sides meet. As a result, a line width W near the junction point is reduced and prevent the issues associated with the residual layer.

Figure 11:
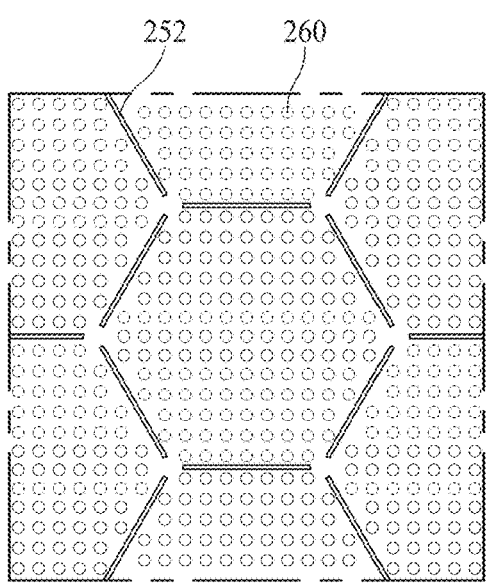
FIG. 11 is an enlarged view illustrating another example of an area A of FIG. 7.

FIG. 11 is a diagram illustrating a third embodiment of a light control device 200. In the third embodiment of the light control device, similarly to the second embodiment, all sides collectively form a hexagonal structure of the honeycomb structure 252. However, all the sides are separated and there is no junction point where two sides of the honeycomb structure 252 meet. Such structure prevents a visibility defect caused by an increase in a line width W. In a structure where all the sides forming the hexagonal structure of the honeycomb structure 252 do not meet each other, a line width W of a contact point is reduced, thereby preventing the issues associated with the residual layer.

Figure 12:
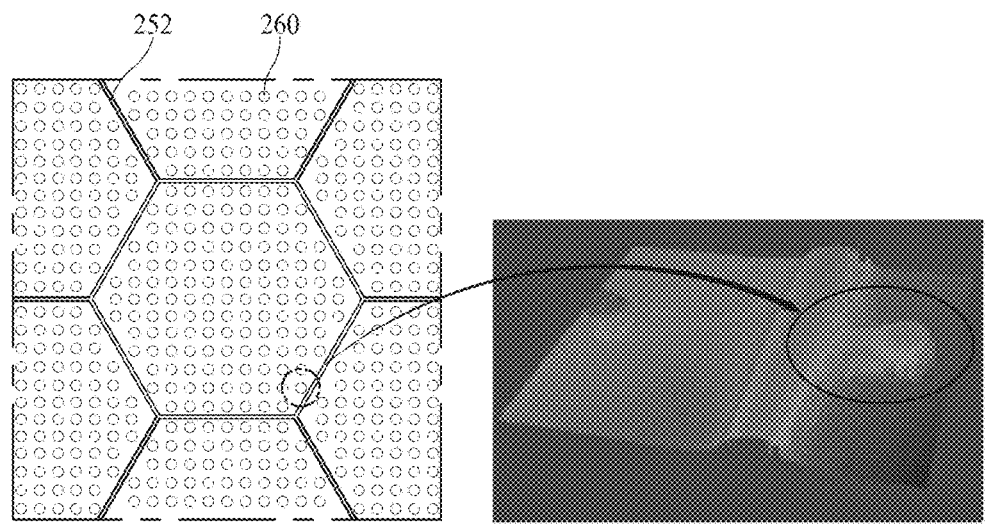
FIG. 12 is a diagram illustrating whether a residual layer occurs when a column spacer is disposed closer to a partition wall than a certain interval.
Figure 13:
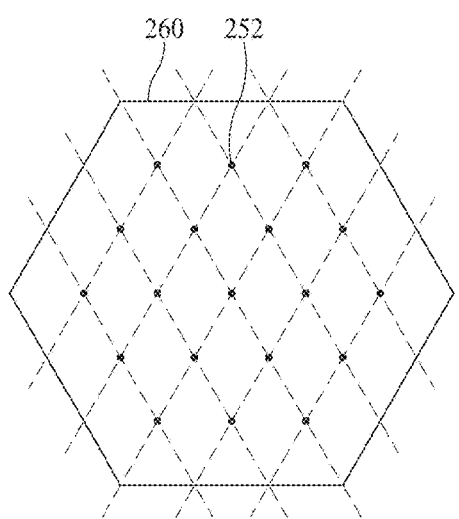
FIG. 13 is an enlarged view illustrating another example of an area A of FIG. 7.

FIG. 12 is a diagram illustrating whether a residual layer occurs when a column spacer is disposed closer to a partition wall than a certain interval. FIG. 13 is a diagram illustrating a fourth embodiment of a light control device 400 according to the present invention.

As seen in FIG. 12, if the column spacer 260 overlaps or is too close to one side of the partition wall 252 of a honeycomb structure, a residual layer may be formed between a side of the partition wall 252 and the column spacer 260 adjacent to the side of the partition wall 252. This may increase the visibility of the partition wall 252 and the column spacer 260. As a result, a display defect may occur, the light shield rate may be reduced, and the light may be leaked.

Therefore, in order to prevent such problems, as illustrated in FIG. 13, a portion where the partition wall 252 having the honeycomb structure overlaps with the column spacer 260 may be removed, and the C/S interval may be adjusted so that distances from all sides of the partition wall 252 having the honeycomb structure to the column spacer 260 are the same. In this case, since a constant distance from one side of the partition wall 252 having the honeycomb structure to the column spacer 260 is maintained, the above-described issue of the partition wall 252 and/or the column spacer 260 becoming visible defect is prevented.

Figure 14:
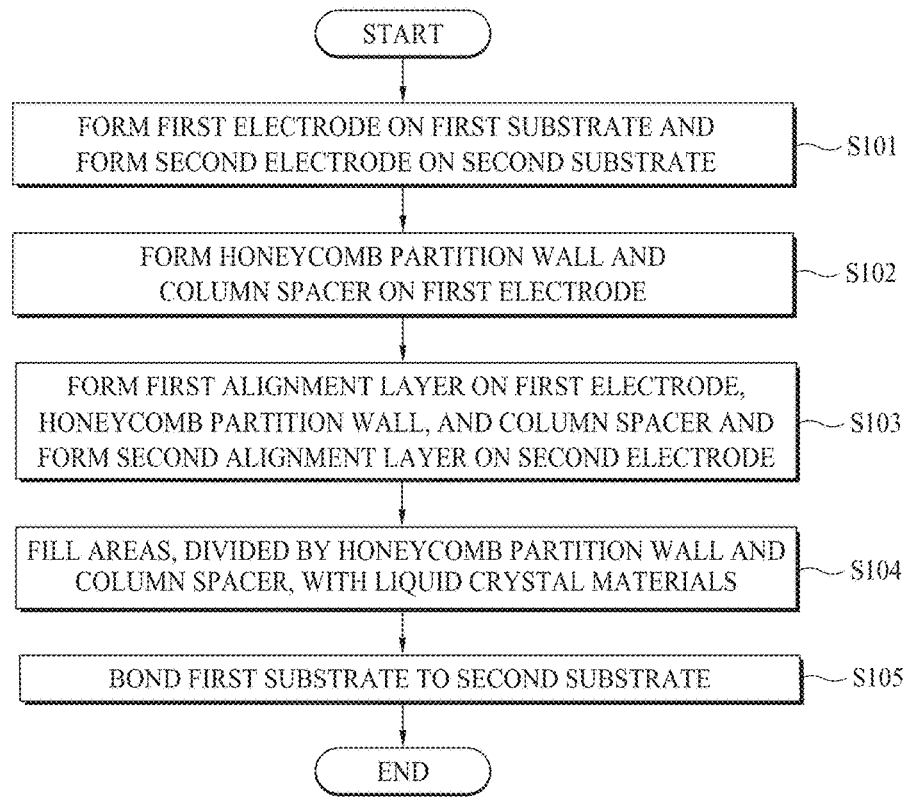
FIG. 14 is a flowchart illustrating a method of manufacturing a light control device according to an embodiment of the present invention.

FIG. 14 is a flowchart illustrating a method of manufacturing a light control device according to an embodiment of the present invention. FIGS. 15A to 15E are cross-sectional views for describing the method of manufacturing the light control device according to an embodiment of the present invention. Hereinafter, the method of manufacturing the light control device according to an embodiment of the present invention will be described in detail with reference to FIGS. 14 and 15A to 15E.

Figure 15A:
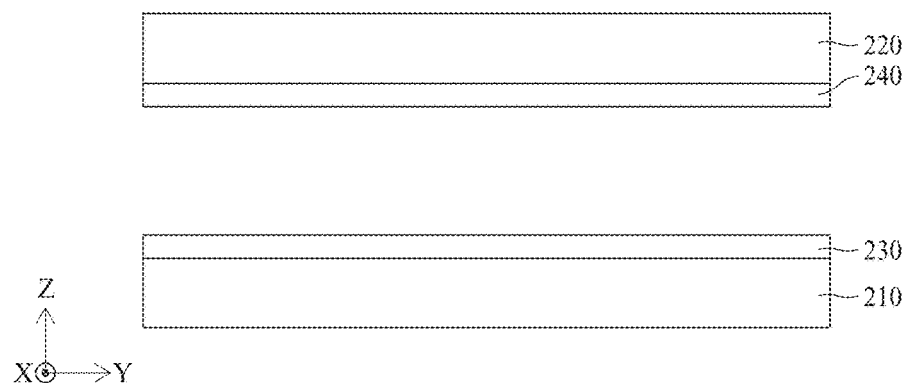
FIGS. 15A to 15E are cross-sectional views for describing the method of manufacturing the light control device according to an embodiment of the present invention.

First, as illustrated in FIG. 15A, the first electrode 230 may be formed on one surface of the first substrate 210 facing the second substrate 220, and the second electrode 240 may be formed on one surface of the second substrate 220 facing the first substrate 210.

Each of the first and second substrates 210, 220 may be a glass substrate or a plastic film. If each of the first and second substrates 210, 220 is plastic film, each of the first and second substrates 210, 220 may be a sheet or a film including cellulose resin such as triacetyl cellulose (TAC) or diacetyl cellulose (DAC), cyclo olefin polymer (COP) such as norbornene derivatives, cyclo olefin copolymer (COC), acrylic resin such as poly(methylmethacrylate) (PMMA), polyolefin such as polycarbonate (PC), polyethylene (PE), or polypropylene (PP), polyester such as polyvinyl alcohol (PVA), poly ether sulfone (PES), polyetheretherketone (PEEK), polyetherimide (PEI), polyethylenenaphthalate (PEN), or polyethyleneterephthalate (PET), polyimide (PI), polysulfone (PSF), or fluoride resin, but is not limited thereto.

Each of the first and second electrodes 230, 240 may be formed S101 of silver oxide (for example, AgO, Ag$_2$O, or Ag$_2$O$_3$), aluminum oxide (for example, Al$_2$O$_3$), tungsten oxide (for example, WO$_2$, WO$_3$, or W$_2$O$_3$), magnesium oxide (for example, MgO), molybdenum oxide (for example, MoO$_3$), zinc oxide (for example, ZnO), tin oxide (for example, SnO$_2$), indium oxide (for example, In$_2$O$_3$), chromium oxide (for example, CrO$_3$ or Cr$_2$O$_3$), antimony oxide (for example, Sb$_2$O$_3$ or Sb$_2$O$_5$), titanium oxide (for example, TiO$_2$), nickel oxide (for example, NiO), copper oxide (for example, CuO or Cu$_2$O), vanadium oxide (for example, V$_2$O$_3$ or V$_2$O$_5$), cobalt oxide (for example, CoO), iron oxide (for example, Fe$_2$O$_3$ or Fe$_3$O$_4$), niobium oxide (for example, Nb$_2$O$_5$), ITO, IZO, aluminum doped zinc oxide (ZAO), aluminum tin oxide (TAO), or antimony tin oxide (ATO), but is not limited thereto.

Figure 15B:
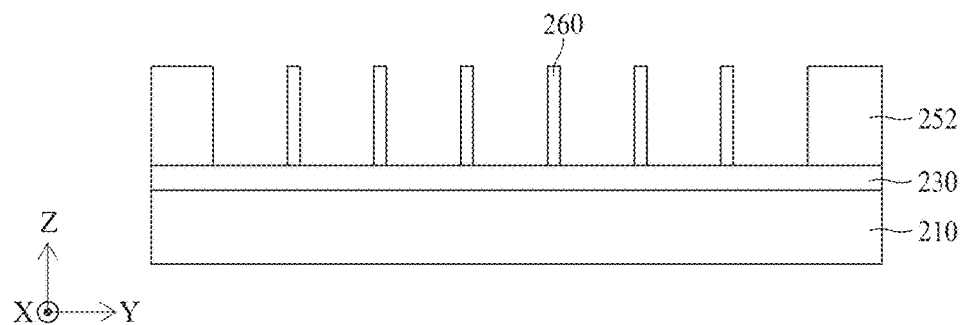

Second, the honeycomb partition wall 252 and the column spacers 260 may be simultaneously formed on one surface of the first electrode 230 facing the second substrate 220, as illustrated in FIG. 15B. The honeycomb partition wall 252 and the column spacers 260 may be formed by an imprinting process or a photolithography process.

If the honeycomb partition wall 252 and the column spacers 260 are formed by the imprinting process, the forming material may be coated on one surface of the first electrode 230 facing the second substrate 220, and then, the honeycomb partition wall 252 and the column spacers 260 may be formed by applying pressure with a mold formed of silicon, quartz, a polymer material, and/or the like.

If the honeycomb partition wall 252 and the column spacers 260 are formed by a photolithography process, a forming material may be coated on one surface of the first electrode 230 facing the second substrate 220, and then, the honeycomb partition wall 252 and the column spacers 260 may be formed S102 by exposing the coated material.

Figure 15C:
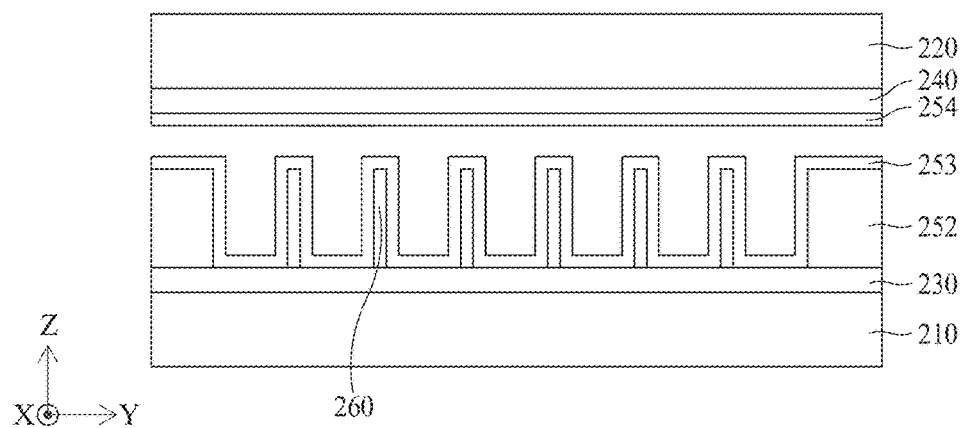

Third, the first alignment layer 253 may be formed S103 on the honeycomb partition wall 252, the column spacers 260, and one surface of the first electrode 230 facing the second substrate 220 as shown in FIG. 15C. Also, the second alignment layer 254 may be formed S103 on one surface of the second electrode 240 facing the first substrate 210. When a voltage is not applied to the first and second electrodes 230, 240, the first and second alignment layers 253, 254 may be vertical alignment layers for arranging a long axis of each of the liquid crystal and the dichroic dyes in the vertical direction (the Z-axis direction).

Figure 15D:
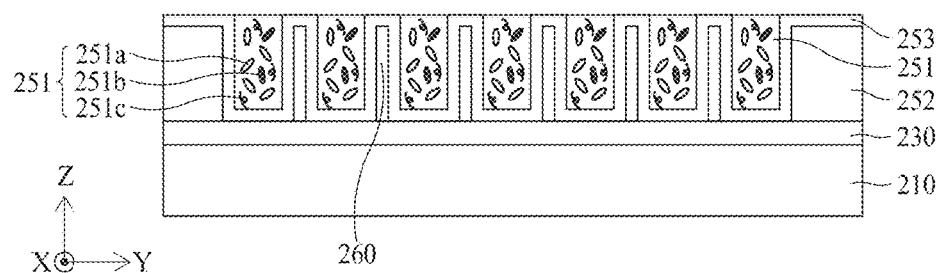

Fourth, the liquid crystal layer 250 may be formed by filling S104 a plurality of areas divided by the partition walls 252 with liquid crystal materials as shown in FIG. 15D. A process of filling the plurality of areas divided by the partition walls 252 with the liquid crystal materials may be performed by an inkjet method. The liquid crystal materials may include the liquid crystal 251a, the dichroic dyes 251b, and the ion materials 251c.

Figure 15E:
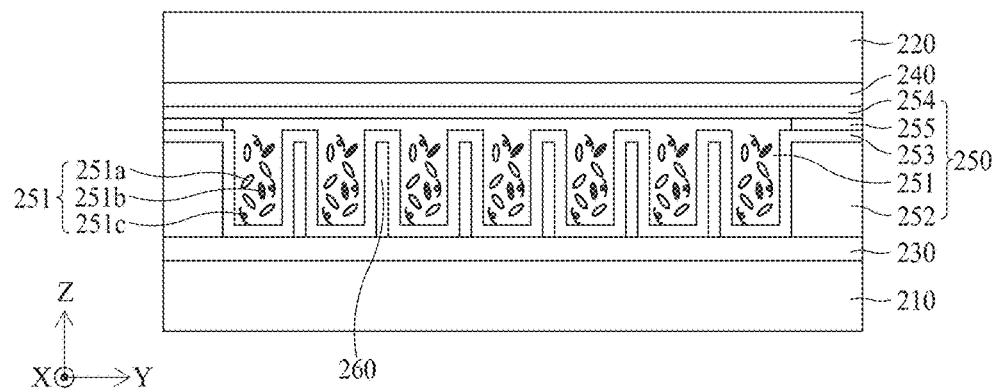

Fifth, as illustrated in FIG. 15E, the first alignment layer 253 may be adhered to the second alignment layer 254, and thus, the first substrate 210 may be bonded S105 to the second substrate 220. The first alignment layer 253 may be adhered to the second alignment layer 254 by using the adhesive layer 255. The adhesive layer 255 may be disposed on the first alignment layer 253 which is disposed on the honeycomb partition wall 252 and the column spacer 260, and the first alignment layer 253 may be adhered to the second alignment layer 254. Alternatively, the adhesive layer 255 may be disposed on one surface of the second electrode 240 facing the first substrate 210, and in this case, the adhesive layer 255 may be disposed on the liquid crystal layer 250 as well as the partition wall 252. In FIG. 15E, the first and second alignment layers 253 and 254 are illustrated as being disposed to be spaced apart from each other on the column spacer 260, but the first alignment layer 253 may contact the second alignment layer 254.

Moreover, the second alignment layer 254 may include an adhesive material. In this case, the second alignment layer 254 may be adhered to the first alignment layer 253 even without the adhesive layer 255, and thus, the adhesive layer 255 may be omitted. The adhesive material included in the second alignment layer 254 may be a silane coupling agent.

Figure 16:
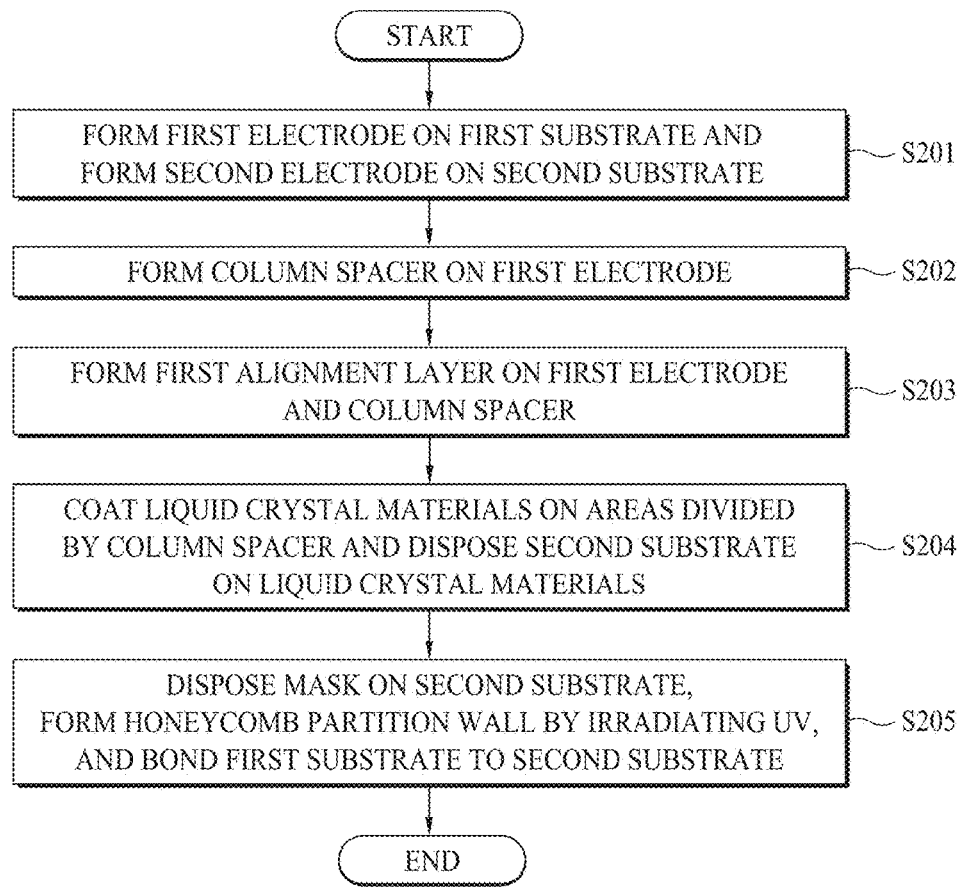
FIG. 16 is a flowchart illustrating another method of manufacturing a light control device according to an embodiment of the present invention.

FIG. 16 is a flowchart illustrating another method of manufacturing a light control device according to an embodiment of the present invention. FIGS. 17A to 17E are cross-sectional views for describing another method of manufacturing the light control device according to an embodiment of the present invention. The method of manufacturing the light control device according to an embodiment of the present invention will be described in detail with reference to FIGS. 16 and 17A to 17E.

Figure 17A:
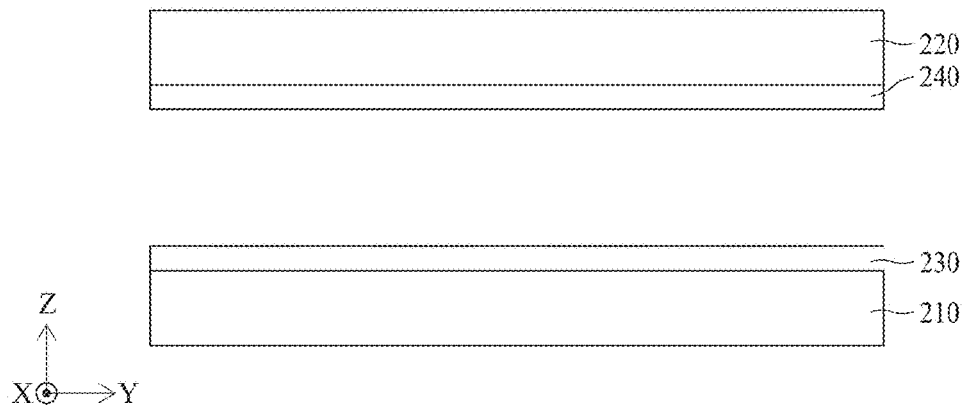
FIGS. 17A to 17E are cross-sectional views for describing another method of manufacturing the light control device according to an embodiment of the present invention.

Operation S201 illustrated in FIG. 16 may be substantially the same as operation S101 described above with reference to FIGS. 14 and 15A to 15E. Thus, a detailed description of operation S201 of the method of manufacturing the light control device illustrated in FIGS. 16 and 17A is omitted herein for the sake of brevity.

Figure 17B:
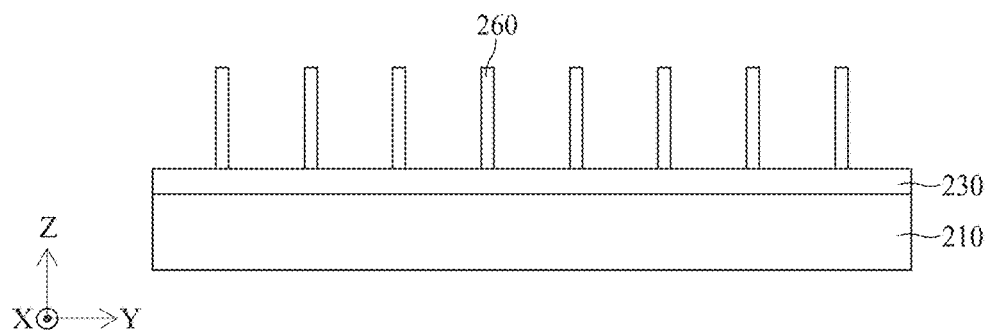

After the substrates 210, 220 and the electrodes 230, 240 are formed, the column spacers 260 may be formed S202 on one surface of the first electrode 230 facing the second substrate 220 as illustrated in FIG. 17B. The column spacers 260 may be formed S202 by an imprinting process or a photolithography process.

Figure 17C:
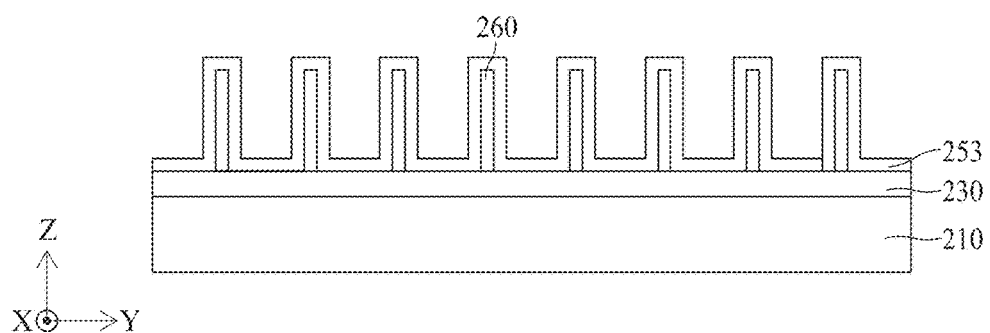

Third, the first alignment layer 253 may be formed S203 on the column spacers 260 and one surface of the first electrode 230 facing the second substrate 220, as illustrated in FIG. 17C. Also, the second alignment layer 254 may be formed on one surface of the second electrode 240 facing the first substrate 210. When a voltage is not applied to the first and second electrodes 230 and 240, the first and second alignment layers 253 and 254 may be vertical alignment layers for arranging a long axis of each of the liquid crystal and the dichroic dyes in the vertical direction (the Z-axis direction).

Figure 17D:
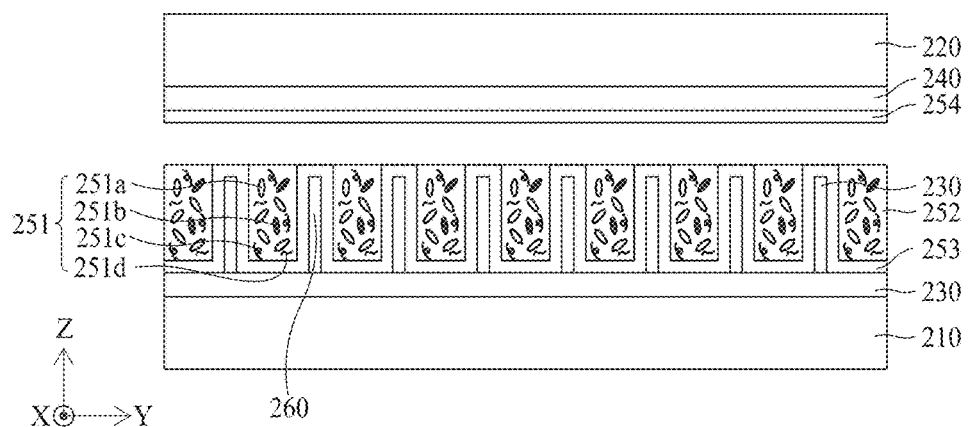

Fourth, the liquid crystal layer 250 may be formed by filling S204 a plurality of areas divided by the partition walls 252 with liquid crystal materials, and the second substrate 220 may be disposed on the liquid crystal layer, as illustrated in FIG. 17D. A process of filling the plurality of areas divided by the partition walls 252 with the liquid crystal materials may be performed in the inkjet method.

The liquid crystal materials may include the liquid crystal 251a, the dichroic dyes 251b, the ion materials 251c, photocurable monomers 251d, and a photoinitiator. When UV is irradiated onto the liquid crystal materials, the dichroic dyes 251b may absorb the UV, and thus, some of the photocurable monomers 251d may not be cured to a polymer. As the amount of the dichroic dyes 251b increase, the dichroic dyes 251b may absorb the UV, and thus, the amount of the monomers 251d remaining in the liquid crystal layer 250 may increase. Therefore, a transmittance of the liquid crystal layer 250 is lowered in the transmissive mode. Accordingly, the dichroic dyes 251b may be included in the liquid crystal materials by 5 wt % or less.

Figure 17E:
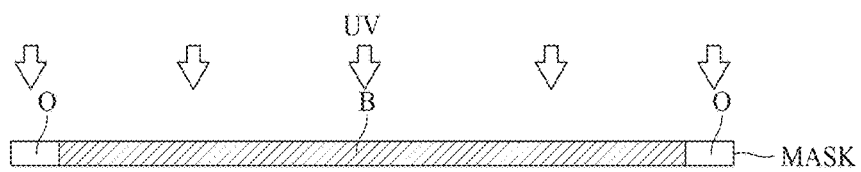
Figure 17E:
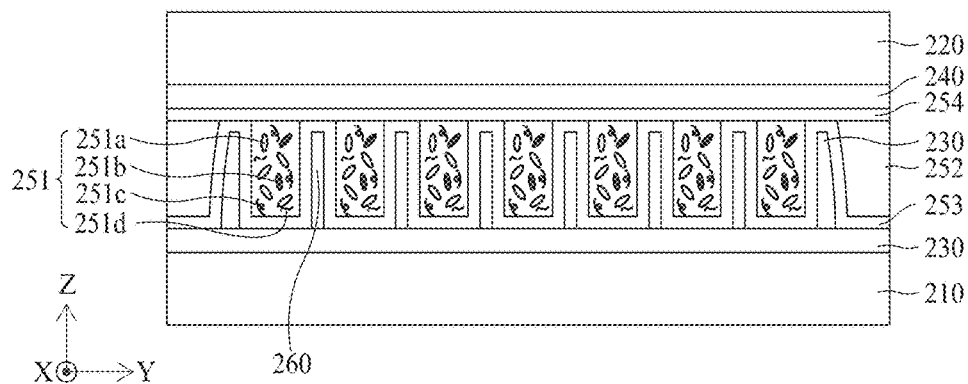

Fifth, as illustrated in FIG. 17E, a mask which includes an opening O and a blocking portion B may be disposed S205 on the second substrate 220, and the photocurable monomers 251d of the liquid crystal materials may be cured by irradiating the UV, thereby forming the honeycomb partition wall 252 and bonding the first substrate 210 to the second substrate 220. In detail, the photocurable monomers 251*d* located in an area onto which the UV is irradiated through the opening O of the mask may be cured, and the photocurable monomers 251*d* located in an area onto which the UV is not irradiated may move to a position at which a concentration of the monomers 251*d* is high. Therefore, the monomers 251*d* may gather in an area corresponding to the opening O of the mask onto which the UV is irradiated in photo-curing the liquid crystal materials may form a polymer wall, and thus, the honeycomb partition walls 252 may be formed.

Figure 18:
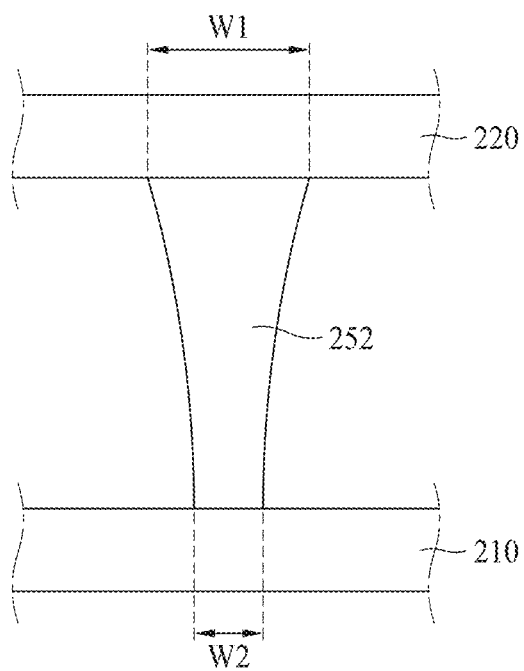
FIG. 18 is a diagram illustrating a structure of a partition wall based on the manufacturing method illustrated in FIG. 16.

FIG. 18 is a diagram schematically illustrating an operation of forming a partition wall by using a method of manufacturing a polymer wall, according to one embodiment. As seen in FIG. 18, the partition wall 252 formed by the manufacturing method according to the present embodiment may have a shape where a width W1 of an upper portion contacting the second alignment layer 254 onto which UV is directly irradiated is broader than a width W2 of a lower portion contacting the first alignment layer 253. This is because a more number of photocurable monomers 251*d* gather in the upper portion W1 onto which the UV is directly irradiated, and thus, curing is performed in a broader range. The light control device based on the method of manufacturing the polymer wall has the following effects.

First, since it is difficult to form the partition wall 252 having a width of 15 µm or less in an exposure process using a film mask, there is a limitation in controlling a light shield rate. However, by using the method of manufacturing the polymer wall, a width of the partition wall 252 may be formed to be about 10 µm, and thus, the light control device having a good light shield rate may be manufactured. In this case, the column spacer 260 may be formed to have the same width as that of the partition wall 252, but is not limited thereto.

Second, in a photo process of simultaneously forming the partition wall 252 and the column spacer 260, a visibility defect is caused by a residual layer as described above. However, by using the method of manufacturing the polymer wall, an order in which the column spacer 260 is formed differs from an order in which the partition wall 252 is formed, thereby preventing the visibility defect from occurring due to the residual layer. In addition, an adhesive layer is not needed.

As described above, according to the embodiments of the present invention, an area of each of the partition walls is minimized, and thus, the light shield rate having a certain level is secured in the light shield mode.

Moreover, according to the embodiments of the present invention, the column spacer may be formed between the honeycomb structures, thereby improving the uniformity of a cell gap.

Moreover, according to the embodiments of the present invention, the partition walls may be designed in the honeycomb structure, and the column spacer may be disposed between the partition walls, thereby preventing a gravity defect of the liquid crystal cell.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A transparent display apparatus comprising:
   a transparent display panel including a plurality of transmissive areas transmitting incident light and a plurality of emissive areas configured to emit light through a first surface of the transparent display panel; and
   a light control device bonded to a second surface of the transparent display panel at an opposite side of the first surface, comprising:
   a first substrate,
   a second substrate parallel to the first substrate,
   a first electrode on the first substrate facing the second substrate,
   a second electrode on the second substrate facing the first substrate,
   partitioning walls on the first electrode and attached to the second electrode, the partitioning walls configured to partition space between the first electrode and the second electrode,
   a first adhesive layer attaching the partitioning walls to the second electrode, and
   liquid crystal in the partitioned space between the partitioning walls; and
   a second adhesive layer between the second surface of the transparent display panel and the light control device, wherein the second adhesive layer has a refractive index of 1.4 to 1.9.

2. The transparent display apparatus of claim 1, further comprising a plurality of column spacers in the partitioned space and separated from the partitioning walls, each of the plurality of column spacer between the first electrode and the second electrode to maintain a distance between the first electrode and the second electrode, wherein each of the plurality of column spacers is pillar shaped with a circular cross-section across a plane parallel to the surfaces of the first and second substrates, the plurality of column spacers separated from each other.

3. The transparent display apparatus of claim 2, wherein each of the column spacers is separated from the partitioning walls by at least a predetermined distance.

4. The transparent display apparatus of claim 2, wherein the column spacers in the partitioned space are separated by a predetermined interval.

5. The transparent display apparatus of claim 2, wherein column spacers adjacent to each of the partitioning walls are separated from each of the partitioning wall by a same distance.

6. The transparent display apparatus of claim 2, wherein an area of the partitioning walls and the plurality of column spacers is 1% to 2% of an area of a layer of the liquid crystal.

7. The transparent display apparatus of claim 1, wherein a set of the partitioning walls form a regular convex polygon shape.

8. The transparent display apparatus of claim 7, wherein the regular convex polygon shape is a hexagon.

9. The transparent display apparatus of claim 8, wherein the partitioning walls form a honeycomb shape.

10. The transparent display apparatus of claim 8, wherein at least one of the set of partitioning wall is separated from another partitioning wall of the set of partitioning wall.

11. The transparent display apparatus of claim 1, further comprising:
    a first alignment layer on the first electrode and on the partitioning walls; and
    a second alignment layer on the second electrode, the second alignment layer attached to portions of the first alignment layer on the partitioning walls.

12. The transparent display apparatus of claim 11, wherein a first width of a portion of each of the partitioning walls abutting the second alignment layer is larger than a second width of a portion of each of the partitioning walls abutting the first electrode.

13. The transparent display apparatus of claim 1, further comprising dichroic dye in the partitioned space.

14. The transparent display apparatus of claim 13, further comprising (i) ion material in the partitioned space for moving the dichroic dye and the liquid crystal in response to applying voltage across the first and second electrodes or (ii) polymer network.

15. The transparent display apparatus of claim 14, further comprising light activated monomer in the partitioned space.

16. A method of manufacturing a transparent display apparatus, comprising:
   forming a transparent display panel including a plurality of transmissive areas transmitting incident light through a first surface of the transparent display panel and a plurality of emissive areas emitting light;
   forming a first electrode on a surface of a first substrate;
   forming a second electrode on a surface of a second substrate;
   forming a plurality of partitioning walls on the first electrode between the first electrode and the second electrode to partition space between the first electrode and the second electrode;
   forming a plurality of column spacers directly on the first electrode and extending towards the second electrode in the partitioned space to maintain distance between the first electrode and the second electrode, the column spacers separated from the partitioning walls;
   filling liquid crystal materials comprising liquid crystal in the partitioned space between the partitioning walls to fabricate a light control device;
   bonding the partitioning walls to the second electrode by a first adhesive layer; and
   bonding the light control device to a second surface of the transparent display panel at an opposite side of the first surface using a second adhesive layer having a refractive index of 1.4 to 1.9.

17. The method of claim 16, further comprising wherein each of the plurality of column spacers is pillar shaped with a circular cross-section across a plane parallel to the surfaces of the first and second substrates, the plurality of column spacers separated from each other.

18. The method of claim 16, wherein a set of the partitioning walls form a honeycomb shape.

19. The method of claim 18, wherein at least one of the set of partitioning wall is separated from another of the set of partitioning wall.

20. The method of claim 16, further comprising:
   forming a first alignment layer on the first electrode and on the partitioning walls; and
   forming a second alignment layer on the second electrode, the second alignment layer attached to portions of the first alignment layer on the partitioning walls.

21. The method of claim 16, wherein the liquid crystal materials comprise dichroic dye.

22. The method of claim 21, wherein the liquid crystal materials further comprise at least one of (i) ion material for moving the dichroic dye and the liquid crystal in response to applying voltage across the first and second electrodes or (ii) polymer network.

* * * * *